United States Patent [19]
McLellan et al.

[11] Patent Number: 5,555,488
[45] Date of Patent: Sep. 10, 1996

[54] INTEGRATED CIRCUIT DEVICE HAVING IMPROVED POST FOR SURFACE-MOUNT PACKAGE

[75] Inventors: Robert N. McLellan, Garland; Anthony M. Chiu, Richardson, both of Tex.

[73] Assignee: Texas Instruments Incorporated, Dallas, Tex.

[21] Appl. No.: 6,899

[22] Filed: Jan. 21, 1993

Related U.S. Application Data

[62] Division of Ser. No. 723,108, Jun. 28, 1991, Pat. No. 5,204,287.

[51] Int. Cl.$^6$ .................... H05K 7/02; H01L 23/28; H01L 23/544
[52] U.S. Cl. .................. 361/820; 174/52.1; 174/52.2; 174/52.4; 257/692; 257/693; 257/696; 257/723; 257/730; 257/787; 257/797; 437/209; 437/219; 439/64; 439/68; 439/525; 439/526; 264/272.11; 264/272.15
[58] Field of Search ............... 29/827, 834; 174/52.1, 174/52.2, 52.4, 260; 228/180.21; 257/666, 668, 673, 676, 687, 692, 693, 696, 723, 737, 787, 797; 361/760, 767, 768, 770, 772, 773, 807, 808, 809, 810, 811; 437/205, 206, 207, 220, 319; 439/68, 70, 525, 72, 78, 526

[56] References Cited

U.S. PATENT DOCUMENTS

| | | | |
|---|---|---|---|
| 3,987,344 | 10/1976 | Ambruoso, Sr. et al. | 174/52.1 |
| 4,138,711 | 2/1979 | Bremenour et al. | 361/752 |
| 4,617,585 | 10/1986 | Yasui | 257/787 |
| 4,967,262 | 10/1990 | Farnworth | 361/760 |
| 4,975,763 | 12/1990 | Baudouin et al. | 257/787 |
| 5,204,287 | 4/1993 | McLellan et al. | 437/209 |
| 5,239,198 | 8/1993 | Lin et al. | 257/693 |
| 5,308,256 | 5/1994 | Tonooko et al. | 439/73 |
| 5,349,235 | 9/1994 | Lee et al. | 257/693 |

FOREIGN PATENT DOCUMENTS

| | | | |
|---|---|---|---|
| 32714 | 10/1964 | Germany | 439/64 |
| 1-230265 | 9/1989 | Japan | 257/696 |
| 2-133985 | 5/1990 | Japan | 257/692 |
| 4-243155 | 8/1992 | Japan | 257/696 |

*Primary Examiner*—Donald A. Sparks
*Attorney, Agent, or Firm*—Warren L. Franz; Robby T. Holland; Richard L. Donaldson

[57] ABSTRACT

An electronic device (10) includes a package (16) having two posts (30) suitable for insertion in PCB holes. Package (16) presents a lengthwise molding plane (32) along which the upper portion (42) and bottom portion (44) of package (16) are mated during the molding process. Posts (30) are disposed substantially exclusively in bottom portion (44) so that posts (30) are asymmetric about lengthwise molding plane (32). Thus, even if a top mold (42a) and a bottom mold (44a) are misaligned there will be no effect on the dimensional tolerance of posts (30) and thus the tolerance of post (30) can be closely matched with a PCB hole (20) tolerance to insure a snug fit. Thus, device (10) is mounted edgewise on a PCB (18) by insertion of posts (30) into PCB holes (20) so that tips (24) of lead fingers (4 14) can be connected to PCB (18) by surfacing-mounting techniques or the like.

15 Claims, 4 Drawing Sheets

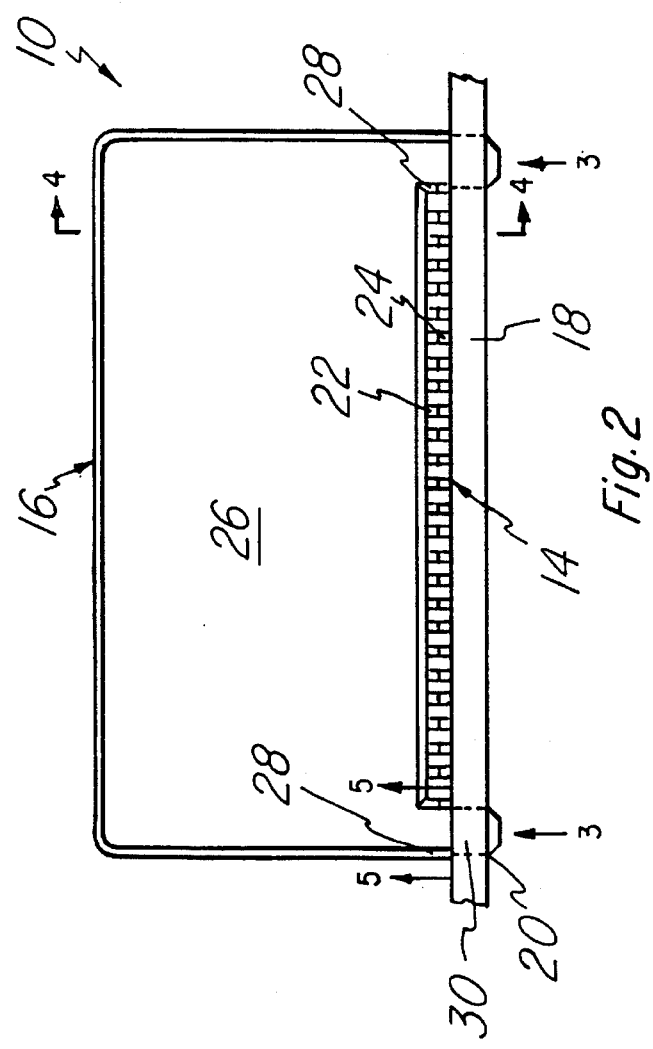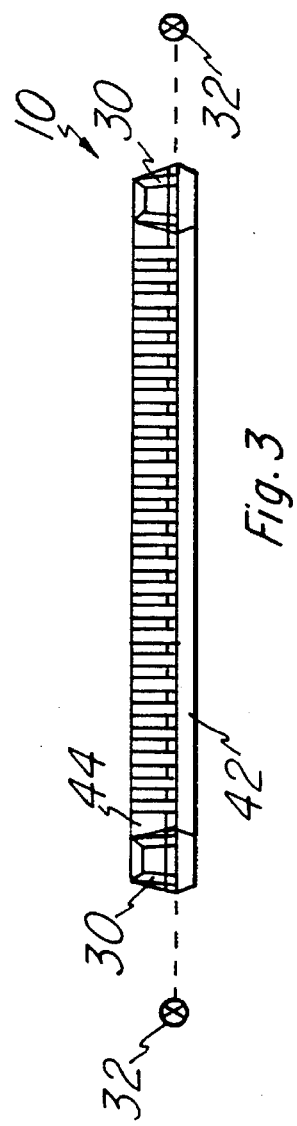

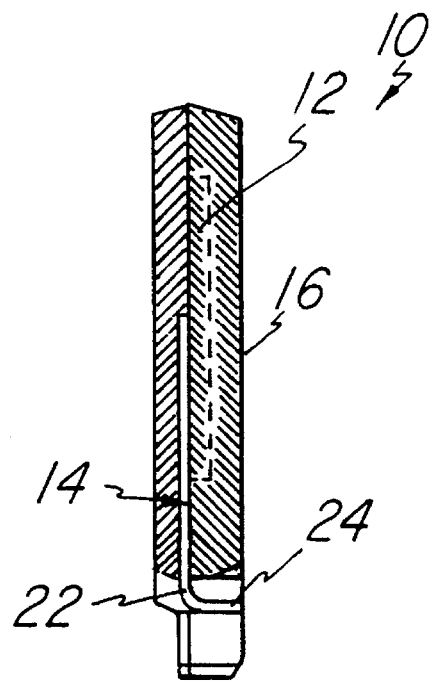
Fig. 4
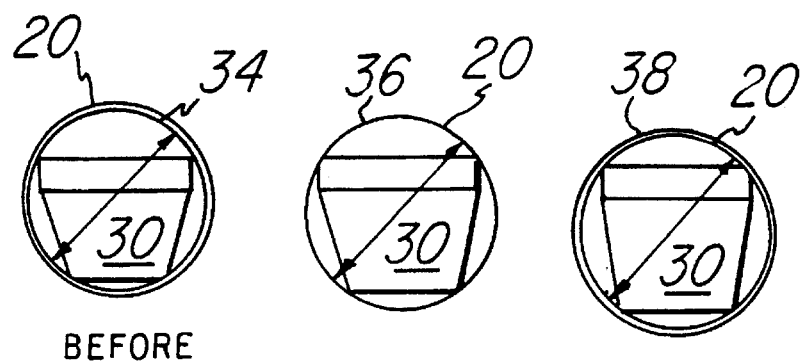
BEFORE INSERTION
Fig. 5a
Fig. 5b
AFTER INSERTION
Fig. 5c

INTEGRATED CIRCUIT DEVICE HAVING IMPROVED POST FOR SURFACE-MOUNT PACKAGE

This is a division of application Ser. No. 07/723,108, filed Jun. 28, 1991, now U.S. Pat. No. 5,204,287.

BACKGROUND OF THE INVENTION

1. Field of the Invention

This invention relates to semiconductor devices, and more particularly to surface-mount packages for integrated circuit devices.

2. Description of the Prior Art

Integrated circuit devices have been housed in dual-in-line plastic packages, referred to as DIP packages, in the bulk of semiconductor manufacture, for many years. These DIP packages have leads which extend through holes in a printed circuit board (PCB), and the package itself is mounted flat on the board. More recently surface-mount packaging has been introduced, and this technique eliminates the necessity of soldering leads in holes in PC boards, so the leads and PC board conductors can be closer together and higher densities are achieved. Similarly, edge-mounted packages or modules have been used in an effort to further increase the density of devices, improve cooling and reduce cost. As the density of devices and circuitry on the dies continues to increase, the packing density must also increase, both at the package level and at the board level, while at the same time providing adequate cooling, and allowing the assembly and soldering of packages and boards to be fast, accurate and nondestructive. In particular, the packaging technique must provide protection for the leads during test, burn-in, and transport, as well as ease of positioning and mechanical support during mounting and soldering and during the life of the system.

SUMMARY OF THE INVENTION

The problems outlined above are in large measure solved by the method in accordance with the present invention. That is to say, the invention hereof provides a device which can be mechanically positioned on a PCB in a stable, secure fashion so that surface-mount or other processes can be performed. The process provides a method wherein the tolerances between the posts of the package and the holes of the PC board may be closely matched. The device and associated method in accordance with the present invention include a package encapsulating a die with a plurality of lead fingers extending from at least one edge of the package. In preferred embodiments, two posts extend from the package from the same edge so that the package may be vertically mounted on the PCB board in a lengthwise fashion. When the device is manufactured the posts are formed in only one of the molds so that tolerances between the post and the PCB holes may be closely matched.

The invention provides an integrated circuit device comprising:

a package encapsulating a semiconductor die, said package presenting a lengthwise molding plane;

a plurality of lead fingers extending from at least one edge of said package, said lead fingers electrically connected to said die; and a plurality of posts integral with said package and extending from said at least one edge of said package, said posts asymmetrically shaped about said lengthwise molding plane to fit into holes in a printed circuit board for mechanically positioning and supporting said package when said lead fingers are affixed to the printed circuit board.

One object of this invention is to provide an improved packaging method for semiconductor integrated circuit devices. Another object is to provide an edge-mounted package for semiconductor devices that does not require soldering of leads into through-holes in a printed circuit board. A further object is to provide a surface-mount package for integrated circuits that is mechanically secure during mounting, soldering and operation, yet does not occupy excess space on the PC board. Still another object is to provide an edge-mount, surface-mount method for integrated circuit devices that allows the leads to be protected during the time from assembly to final system use, and allows accurate positioning of the leads on a PC board. Yet another object is to provide a package with posts such that the dimension tolerances of the posts can be closely matched with tolerances of the PCB holes.

BRIEF DESCRIPTION OF THE DRAWINGS

FIG. 2 is an elevational view of an electronic device incorporating the invention, wherein the device is surface-mounted on a printed circuit board;

FIG. 3 is a bottom view of the electronic device of FIG. 2 as viewed from the direction of arrows 3;

FIG. 4 is a sectional view of device 10 taken along line 4—4 of FIG. 2;

FIGS. 5A–5C are progressive sectional views taken at line 5—5 of FIG. 2 illustrating progressive steps in the insertion of a post of the device into a hole on the PCB;

DETAILED DESCRIPTION OF THE PREFERRED EMBODIMENT

Figure 1A:
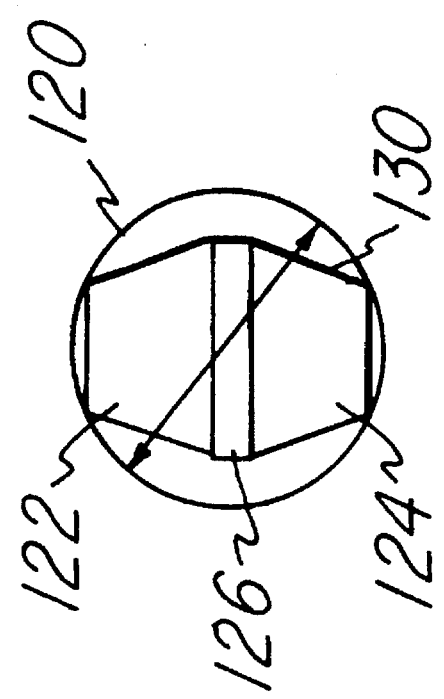
FIG. 1A is a depiction of an idealized post of a prior art device.

Referring now to the drawings in general and FIG. 1A in particular, a prior art idealized post 130 is shown inserted into a hole 120 of a printed circuit board or PCB (not shown) so that the complete prior device (not shown) can be vertically mounted on the PCB. FIG. 1A shows an idealized post 130 having a top post portion 122 and a bottom post portion 124 which are perfectly mated and aligned. By way of example, edge 126 has a length of 1.016-mm. The effective diameter for post 130 is about 1.3572-mm, and is indicated by the arrows spanning hole 120 in FIG. 1A.

Figure 1B:
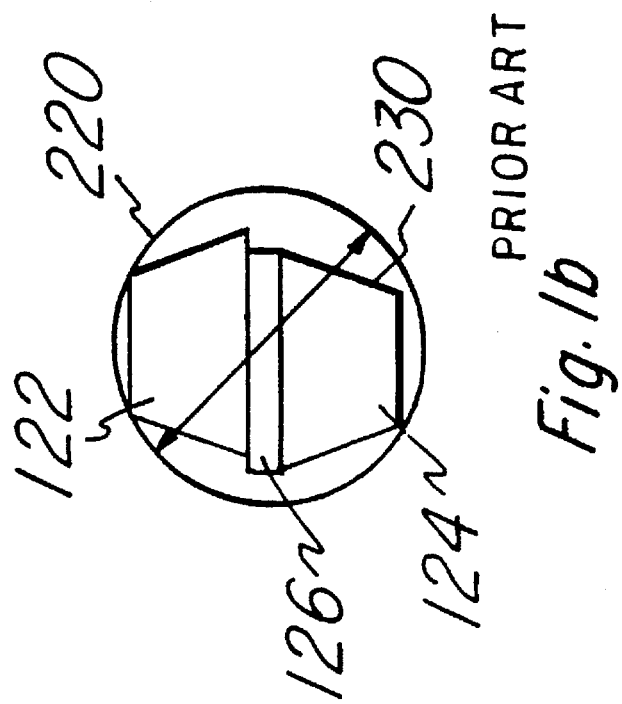
FIG. 1B is a depiction of a practical post of a device of the prior art.

FIG. 1B shows an actual prior art post 230 inserted into a hole 220. Post 230 exhibits molding misalignment between top post portion 122 and bottom post portion 124. This misalignment results in an effective diameter for post 230 of about 1.3931-mm, indicated by the arrows spanning hole 220 in FIG. 1B.

The effective diameter of post 230 is about 0.0359-mm greater than the effective diameter of post 130. (It should be noted that FIGS. 1A and 1B, as well as the rest of the drawings are not drawn to scale.) Thus, in the prior art, the misalignment of post portions 122, 124 results in a greater tolerance required for practical PCB holes 220. There is a greater likelihood that post 230 will not fit snugly into the hole. In this fashion, the prior art device is unstably positioned for surface mounting which can lead to poor mechanical positioning of the leads, poor reflow solder connections, etc. What is needed is a post without such potential misalignment of the top and bottom portions so that the actual tolerance of the post and hole can be closely correlated resulting in a snug fit.

Turning now to the present invention and referring to FIG. 2, an electronic device 10 has a die 12 (see FIG. 4), a plurality of lead fingers 14, and a package 16. Package 16 is adapted to be fitted into a printed circuit board (PCB) 18 having a plurality of holes 20 so that device 10 is stably, securely mounted on PCB 18 both before and after solder reflow. PCB 18 can be any kind of a circuit board, hybridized or otherwise.

Referring to FIG. 4, device 10 is shown cross sectionally in a view taken along line 4—4 as shown in FIG. 2. Die 12 is shown encapsulated by package 16 in FIG. 4. Die 12 is conventional in nature. Die 12 includes the typical components of the microelectronic art and is generally made of monocrystalline silicon but other substrate materials could also be used—for example, but not by way of limitation, germanium and gallium arsenide. In one embodiment, die 12 is a 4 megabit DRAM die such as the type manufactured by Texas Instruments Incorporated of Dallas, Tex., but other types of dies well known in the microelectronic industry (for example any other type of memory device, logic device or indeed discrete devices and other kinds of integrated devices), could utilize the present invention and are contemplated as being within the realm of the invention.

Still referring to FIG. 4, lead fingers 14 are conventionally attached to die 12 at bonding pads or the like. Each lead finger 14 has a lead foot 22 extending from package 16. Each foot 22 includes a tip 24 which is surface-mounted to PCB 18 in a conventional fashion (see also FIG. 2). It should be noted that PCB 18 is omitted from FIG. 4 for clarity of illustration.

Referring again to FIG. 2, package 16 includes package body 26, post stops 28 and two posts 30 (posts 30 are shown in phantom in FIG. 2). Body 26 presents a lengthwise molding plane which is in the plane of the page as viewed in FIG. 2 (reference numerals 32 in FIG. 3 also indicate the lengthwise plane). Body 26 is conventionally formed by, for example, molding to envelope die 12. Posts 30 are adapted to snugly fit into PCB holes 20.

Referring to FIG. 3, device 10 is shown from a bottom view as indicated by arrows 3 in FIG. 2. PCB 18 is omitted for clarity of illustration. Posts 30 are more clearly seen to be tapered in FIG. 3. It will also be noted that posts 30 are asymmetrically shaped about the lengthwise molding plane indicated by reference numerals 32, which show an axial line cutting device 10 in a plane transverse to the plane of the page as viewed in FIG. 3. The lengthwise plane indicated by reference numerals 32 is the mating plane for molding purposes (see FIG. 6). That is to say, posts 30 are disposed substantially exclusively above the lengthwise plane while substantially no portions of posts 30 are disposed below the lengthwise plane.

Referring now to FIGS. 5A–5C, progressive, detailed sectional views are shown of one post 30 situated in one hole 20 taken from line 5—5 as shown in FIG. 2. All other portions of device 10 and PCB 18 have been omitted from FIGS. 5A–5C except those portions shown, for clarity of illustration. In addition to showing the perimeter of PCB hole 20, FIGS. 5A–5C each utilize arrows to indicate an effective diameter of post 30 at the hole 20. This is done for comparison of the effective diameter of post 30 with the diameter of hole 20 as post 30 is progressively inserted. In the preferred embodiment the diameter of PCB hole 20 is 1.194-mm (roughly 47 mils).

FIG. 5A shows a view of post 30 at the beginning of insertion into PCB hole 20. Post 30 has an effective diameter of 1.096-mm. This effective diameter describes a circle indicated by reference numeral 34. FIG. 5B shows an intermediate stage of insertion of post 30 into hole 20. The effective diameter of post 30 at this stage of insertion is about 1.160-mm. The perimeter of the circle described by this effective diameter is indicated by reference numeral 36 and is substantially the same as the perimeter of hole 20 itself as indicated in FIG. 5B. FIG. 5C shows the final stage of insertion where post 30 has an effective diameter of about 1.270-mm. The perimeter of the circle described by this effective diameter is indicated by reference numeral 38. This effective diameter will result in interference with holes 20 on PCB 18 to ensure snug fit for processing.

Figure 6:
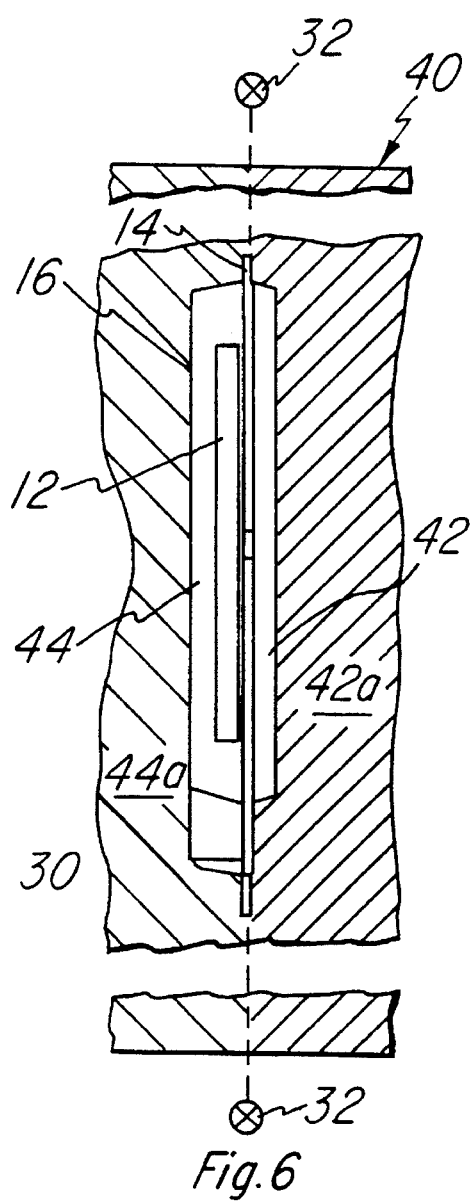
FIG. 6 is a partial sectional view analogous to FIG. 4, of a mold surrounding the device.

FIG. 6 shows a sectional elevational view of device 10 enveloped by an inventive mold set 40. It will be noted that device 10 is shown in a reverse orientation compared with that of FIG. 4. PCB 18 is not shown because the molding process takes place prior to mounting of device 10 on PCB 18. It is further seen that post 30 is asymmetrical about the lengthwise plane (which is transverse to the plane of the page as viewed in FIG. 6), the lengthwise plane once again being indicated by reference numerals 32.

Mold set 40 includes a top mold 42a which forms top portion 42 of package 16, and a bottom mold 44a which forms a bottom portion 44 of package 16 (see also FIG. 3). Top and bottom molds 42a, 44a mate at the lengthwise plane. Before molding, die 12 is mounted and then wire bonded to the leadframe having lead fingers 14. Device 10 is then placed in between molds 42a, 44a for encapsulation. It will be readily appreciated that lead fingers 14, as shown in FIG. 6, are not formed to the final orientation as shown in FIG. 2.

Figure 7:
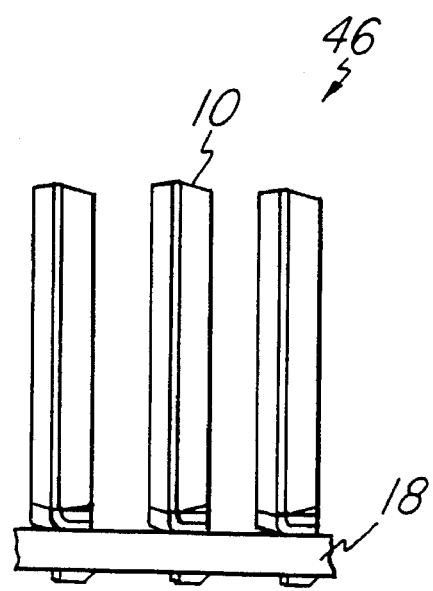
FIG. 7 is a partial elevational view of a system incorporating a plurality of inventive devices surface-mounted on a PCB.

FIG. 7 shows an electronic system 46 having a plurality of devices 10 mounted on PCB 18 in accordance with the invention. Devices 10 are vertically mounted on PCB 18 to maximize packing density and further take advantage of the beneficial aspects of the invention as described herein.

The process for manufacturing device 10 and/or system 46 will now be described. Die 12 (with lead fingers 14 conventionally mounted thereon) is placed in top mold 42a. Top and bottom molds 42a, 44a are mated at a mold juncture along the lengthwise plane as indicated from different views in FIGS. 3 and 6. A mold compound, for example a synthetic resin material such as Shinetsu 165 vA is then injected into mold set 40 and cured. Molds 42a, 44a are then removed and lead fingers 14 are formed, yielding device 10 as shown in FIG. 4. A plurality of holes 20 are then drilled in PC board 18. In the preferred embodiment, each device 10 will have two posts 30, but any other number of posts can be used depending on the application. Posts 30 of a plurality of devices 10 are then inserted into corresponding PCB holes 20. The tapered profile of posts 30 facilitates this insertion. Devices 10 are then reflow soldered on PCB 18 by a conventional process such as Infra-red reflow or vapor phase reflow at lead tips 24, such processing being well known in the art. Thus system 46 is completed.

It will be readily appreciated that a system could have only one device 10 rather than a plurality of devices 10, and the single device 10 could be surface-mounted on PCB 18 as described above, but in the preferred embodiment a plurality of devices 10 is mounted, such as shown in FIG. 7.

Since the final effective diameter after insertion (as described by circle 38 in FIG. 5C) is greater than the diameter of PCB hole 20, a snug fit is guaranteed. Stops 28 insure that tapered posts 30 are not over-inserted, thereby avoiding inadvertent damage to lead fingers 14. Thus an effective surface-mounting process is facilitated.

It will be noted that posts 30 are formed only in bottom mold 44a. (Those skilled in the art will readily appreciate that the distinction between top mold 42a and bottom mold 44a is relative and the terms top mold and bottom mold are essentially interchangeable.) Since posts 30 are formed only in bottom mold 44a, they are thus formed asymmetrically. See FIG. 3 where it is demonstrated that posts 30 reside substantially exclusively above the lengthwise plane indicated by reference numerals 32 and substantially no portion of either post 30 resides below lengthwise plane 32. In the illustrated embodiment, the posts 30 are formed at the juncture of molds 42a, 44a, with a top surface coincident with the lengthwise mold plane and a tapered tip. The tip has a generally trapezoidal cross-section, with base defined by the top surface and a top and sides defined by other post surfaces having tapered tip ends formed in bottom mold 44a. Since the potential for detrimental misalignment (as illustrated in FIG. 1B) is eliminated, the diameter of post 30 can be closely matched with the diameter of PCB hole 20. Hence PCB 18 can have tighter tolerances for holes 20, insuring tight fit of posts 30 into holes 20. Devices 10 will thus be securely fitted on PCB 18 allowing effective surface-mounting procedures. Thus, according to the invention, the improved posts 30 allow for a snugger fit of posts 30 into holes 20 for greater mechanical stability and a better resultant surface-mounting procedure.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. An integrated circuit device having an improved post for surface-mount packaging, said device comprising:
    an integrally molded package encapsulating a semiconductor die, said package presenting a lengthwise molding plane;
    a plurality of lead fingers extending from at least one edge of said package, said lead fingers electrically connected to said die; and
    a plurality of posts integral with said package and extending from said at least one edge of said package, said posts asymmetrically shaped about said lengthwise molding plane to fit into holes in a printed circuit board for mechanically positioning and supporting said package when said lead fingers are affixed to the printed circuit board.

2. The device of claim 1 wherein at least one of said posts is formed on one side of said lengthwise molding plane.

3. The device of claim 1 wherein said package substantially includes synthetic resin material molded around said die and bonded lead fingers.

4. The device of claim 1 wherein said lead fingers are bent to present a face perpendicular to said lengthwise molding plane.

5. An electronic circuit board system comprising:
    a printed circuit board having a plurality of holes; and
    a plurality of integrated circuit devices mounted on said board, at least one of said devices edge-mounted on said board;
    said at least one device including:
        a package molded around a semiconductor die, said package presenting a lengthwise molding plane;
        a plurality of lead fingers extending from at least one edge of said package, said lead fingers electrically connected to said die; and
        a plurality of posts integral with said package extending from said at least one edge of said package, at least one of said posts asymmetrically shaped about said lengthwise molding plane to fit into one of said holes in said printed circuit board for mechanically positioning and supporting said package when said lead fingers are affixed to said printed circuit board.

6. The system of claim 5 wherein said at least one post is formed on one side of said lengthwise molding plane.

7. The system of claim 5 wherein said devices are edge-mounted devices parallel to one another, and each device has a package encapsulating a semiconductor die, said package presenting a lengthwise molding plane, and each device further includes at least one post asymmetrically shaped about said lengthwise molding plane.

8. A semiconductor packaged device, comprising:
    a semiconductor die encapsulated in a molded package formed of two integral portions mated at a lengthwise mold juncture;
    a plurality of lead fingers, at least some of which extend from an edge of said package and are electrically connected to said die; and
    at least one post extending from said edge beyond said at least some lead fingers and from only one of the integral portions, integral therewith; said at least one post being dimensioned and configured relative to said lead fingers so that said at least one post can be fitted into a hole in a printed circuit board for mechanically positioning and supporting said package while said lead fingers are electrically connected to a facing surface of said board.

9. The device of claim 8 wherein said mold juncture is a lengthwise molding plane and said at least one post has a surface coincident with said lengthwise molding plane.

10. The device of claim 9 wherein said post has a tip with generally trapezoidal cross-section and three tapered tip surfaces, with said coincident surface forming a base and said tapered tip surfaces respectively forming a top and sides of said trapezoidal cross-section.

11. The device of claim 10, in combination with said printed circuit board and hole, said hole having a diameter, and said tapered surfaces being dimensioned and configured so that when said at least one post is fitted within said hole, said trapezoidal cross-section has an effective diameter describing a circle whose perimeter is less than the perimeter of said hole diameter at a beginning of insertion, substantially the same as said hole perimeter at an intermediate stage of insertion, and in interference with said hole perimeter at a final stage of insertion.

12. The device of claim 10 wherein said device has two posts having the recited characteristics of said at least one post.

13. The device of claim 8 wherein said post has a tip with generally trapezoidal cross-section and three tapered tip surfaces, with said coincident surface forming a base and said tapered tip surfaces respectively forming a top and sides of said trapezoidal cross-section.

14. The device of claim 13, in combination with said printed circuit board and hole, said hole having a diameter, and said tapered surfaces being dimensioned and configured so that when said at least one post is fitted within said hole, said trapezoidal cross-section has an effective diameter describing a circle whose perimeter is less than the perimeter of said hole diameter at a beginning of insertion, substantially the same as said hole perimeter at an intermediate stage of insertion, and in interference with said hole perimeter at a final stage of insertion.

15. An integrated circuit device, comprising:

a package encapsulating a semiconductor die, said package including a plurality of posts integral therewith and extending from at least one edge of said package, said package presenting a lengthwise molding plane; and a plurality of lead fingers electrically connected to said die, said lead fingers extending from at least one edge of said package;

at least one of said posts being only on one side of said lengthwise molding plane so as to fit into holes in a printed circuit board for mechanically positioning and supporting said package when said lead fingers are affixed to a printed circuit board.

* * * * *